(12) United States Patent
Sun et al.

(10) Patent No.: US 10,088,929 B2
(45) Date of Patent: Oct. 2, 2018

(54) OLED TOUCH CONTROL DISPLAY DEVICE AND MANUFACTURING METHOD THEREOF, AND METHOD FOR MANUFACTURING TOUCH CONTROL SCREEN

(71) Applicant: SHENZHEN ROYOLE TECHNOLOGIES CO. LTD., Shenzhen (CN)

(72) Inventors: Jiasong Sun, Shenzhen (CN); Zihong Liu, Shenzhen (CN); Xiang Zou, Shenzhen (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/111,936

(22) PCT Filed: Jan. 27, 2014

(86) PCT No.: PCT/CN2014/071582
§ 371 (c)(1),
(2) Date: Jul. 15, 2016

(87) PCT Pub. No.: WO2015/109601
PCT Pub. Date: Jul. 30, 2015

(65) Prior Publication Data
US 2016/0342253 A1    Nov. 24, 2016

(51) Int. Cl.
*G06F 3/041*    (2006.01)
*G06F 3/044*    (2006.01)
(Continued)

(52) U.S. Cl.
CPC .......... *G06F 3/0412* (2013.01); *G06F 3/044* (2013.01); *G06F 3/0416* (2013.01);
(Continued)

(58) Field of Classification Search
CPC ...... G06F 3/041; G06F 3/0412; G06F 3/0416; G06F 3/044; G06F 3/047; G06F 2203/04103; G06F 2203/04104
(Continued)

(56) References Cited

U.S. PATENT DOCUMENTS

2002/0167270 A1* 11/2002 Siwinski ............... G06F 3/041
313/506
2002/0186208 A1* 12/2002 Feldman .............. G06F 3/0412
345/173
(Continued)

*Primary Examiner* — Alexander Eisen
*Assistant Examiner* — Nelsom Lam
(74) *Attorney, Agent, or Firm* — Hauptman Ham, LLP (57) ABSTRACT

The present invention provides an OLED touch control display device, a method for manufacturing an OLED touch control display device, and a method for manufacturing a touch control screen. The OLED touch control display device comprises a substrate having a first surface and a second surface arranged opposite the first surface, a touch control screen arranged on the first surface, defining a display area arranged on the second surface, a touch control interface circuit connected to the touch control screen, defining an interface binding area connected to the display area, and defining via holes penetrating the first surface and the second surface. The touch control interface circuit and the interface binding area are arranged on the first surface or the second surface. The touch control screen includes touch control pattern areas arranged in a matrix and connected together via the via holes.

17 Claims, 4 Drawing Sheets

(51) Int. Cl.
　　　*G09G 3/3208*　　　(2016.01)
　　　*H01L 27/32*　　　(2006.01)
　　　*H01L 51/00*　　　(2006.01)

(52) U.S. Cl.
　　　CPC ......... *G09G 3/3208* (2013.01); *H01L 27/323* (2013.01); *G06F 2203/04102* (2013.01); *G06F 2203/04103* (2013.01); *G06F 2203/04111* (2013.01); *H01L 51/0097* (2013.01); *H01L 2251/5338* (2013.01); *H01L 2251/558* (2013.01)

(58) Field of Classification Search
　　　USPC .................. 345/76–83, 173–179; 315/169.3
　　　See application file for complete search history.

(56) References Cited

U.S. PATENT DOCUMENTS

| | | | |
|---|---|---|---|
| 2011/0141037 A1* | 6/2011 | Hwang | G06F 3/044 345/173 |
| 2011/0193799 A1* | 8/2011 | Jun | H01L 27/323 345/173 |
| 2011/0316802 A1* | 12/2011 | Choi | G06F 3/041 345/173 |
| 2012/0146942 A1* | 6/2012 | Kamoshida | G06F 3/044 345/174 |
| 2013/0057495 A1* | 3/2013 | Wang | G06F 3/044 345/173 |
| 2014/0111442 A1* | 4/2014 | Cok | G06F 3/044 345/173 |
| 2014/0225859 A1* | 8/2014 | Badaye | G06F 3/044 345/174 |

\* cited by examiner

OLED TOUCH CONTROL DISPLAY DEVICE AND MANUFACTURING METHOD THEREOF, AND METHOD FOR MANUFACTURING TOUCH CONTROL SCREEN

FIELD OF THE TECHNICAL

The present disclosure relates to display technology field, and particularly to an OLED touch display device, and further relates to a method for manufacturing an OLED touch display device and a method for manufacturing a touch control screen.

BACKGROUND

Presently, the existing organic light-emitting diode (OLED) touch control display screens are mostly applied in terminal devices for human-machine interaction, for example, mobile phones, tablet computers, automatic selling machines, information query machines, and so on. Generally, the OLED touch control display screen includes an OLED panel having image display function, a touch control panel attached to the OLED panel and configured to realize touch control function, a display driving circuit arranged on the OLED panel to drive the OLED panel to display image, and a touch control driving circuit arranged on the touch control panel to cause the touch panel to have the touch control function. The OLED panel and the touch panel are attached together by optical adhesive or other attachment manners. However, for such an OLED touch control display screen, the process and technology are complex, and furthermore, the thickness is great, the cost is high, and the structure is redundant.

SUMMARY

The purpose of the present invention is to provide an OLED touch control display device, which realizes touch control and display function by arranging via holes in the same substrate. The present invention aims to solve the problem of that in the present technology, the thickness of the OLED touch control display device is great and the structure of the OLED touch control display device is redundant.

The present invention is realized by providing an OLED touch control display device which includes: a substrate comprising a first surface and a second surface arranged opposite the first surface, a touch control screen arranged on the first surface, defining a display area on the second surface, a touch control interface circuit connected to the touch control screen, defining an interface binding area connected to the display area, and defining a plurality of via holes penetrating the first surface and the second surface, wherein the touch control interface circuit and the interface binding area are arranged on the first surface or the second surface through the via holes, the touch control screen comprises touch a plurality of control pattern areas arranged in a matrix and connected together through the via holes.

Furthermore, the touch control pattern areas comprise a plurality of row touch control pattern units, a plurality of column touch control pattern units intersecting with the row touch control pattern units, first connection lines each connected between two adjacent row touch control pattern units, and second connection lines each connected between two adjacent column touch control pattern units; the via hole comprises a first via hole and a second via hole, and the first via hole and the second via hole are arranged between two adjacent column touch control pattern units; the second connection line comprises a first connection segment arranged on the first surface and electrically connected between the first via hole and the column touch control pattern unit adjacent to the first via hole, a second connection segment arranged on the first surface and electrically connected between the second via hole and the column touch control pattern unit adjacent to the second via hole, a first conductive line arranged on the second surface and electrically connected to the first via hole and the second via hole, and the first conductive line intersects with the first connection line.

Furthermore, the first connection line is arranged on the first surface and connected between two adjacent row touch control pattern units, the first connection segment and the second connection segment are arranged at opposite sides of the first connection line, and the projection of the first conductive line on the first surface intersects with the first connection line.

Preferably, opposite ends of the first conductive line are electrically connected to the first via hole and the second via hole respectively, the first via hole and the second via hole are connected in serial among the first connection segment, the first conductive line, and the second connection segment.

Preferably, the first conductive line is a touch control signal line arranged on the second surface, and electrically connected to the first via hole and the second via hole of each column touch control pattern unit in the same column.

Optionally, a plurality of pixel units arranged in an array and display driving circuits each corresponding to one pixel unit and configured to light the corresponding pixel unit up are arranged on the second surface, each display driving circuit comprises a source, and the first conductive line is a multiplex touch control signal line and electrically connected to the source of the display driving circuit of the corresponding column.

Furthermore, the via hole further comprises a third via hole and a fourth via hole, and the third via hole and the fourth via hole are arranged at two sides of two adjacent row touch control pattern units.

The first connection line comprises a third connection segment arranged on the first surface and electrically connected between the third via hole and the row touch control pattern unit adjacent to the third via hole, a fourth connection segment arranged on the first surface and electrically connected between the fourth via hole and the row touch control pattern unit adjacent to the fourth via hole, and a second conductive line arranged on the second surface and electrically connected to the third via hole and the fourth via hole.

The second conductive line is electrically connected to the third via hole and the fourth via hole of each row touch control pattern unit in the same row, the first conductive line is electrically connected to the first via hole and the second via hole of each column touch control pattern unit in the same column, and the first conductive line intersects with the second conductive line on the second surface.

Furthermore, the touch control screen further comprises a touch control interface circuit arranged on the first surface or the second surface, the touch control interface circuit comprises a driving interface and a test interface, the via hole is electrically connected to the driving interface and the test interface through the second connection line, or the via hole is electrically connected to the driving interface and the test interface through the first connection line and the second connection line.

Furthermore, the column touch control pattern units and the row touch control pattern units are quadrilateral shaped, pentagon shaped, hexagon shaped, circle shaped, or any other shape.

Furthermore, the substrate is a glass substrate or flexible substrate.

Furthermore, the display area comprises a plurality of pixel units arranged in an array and display driving circuits each corresponding to one pixel unit and configured to light the corresponding pixel unit up.

Furthermore, the OLED touch control display device further comprises a touch control interface circuit connected to the touch control screen and an interface binding area connected to the display area, and the touch control interface circuit and the interface binding area are arranged on the first surface or the second surface through the via holes.

Furthermore, the pixel units comprise a plurality of groups of row pixel units and column pixel units, and the plurality of groups of row pixel units and column pixel units are arranged in an array, the row pixel units comprise a plurality of first pixel units spaced at equal distance, the column pixel units comprise a plurality of second pixel units spaced at equal distance; each first pixel unit and each second pixel unit are respectively controlled by the corresponding display driving circuits.

The present invention further provides a method for manufacturing a touch control screen which includes the following steps.

A substrate is provided, wherein the substrate comprises a first surface and a second surface arranged opposite the first surface, the substrate defines a plurality of via holes penetrating the first surface and the second surface, and the via hole comprises a first via hole and a second via hole.

A plurality of row touch control pattern units and column touch control pattern units are formed, wherein the plurality of row touch control pattern units arranged in rows are formed on the first surface, and the plurality of column touch control pattern units arranged in columns and intersecting with the row touch control pattern units are formed on the first surface.

A plurality of first connection lines are formed, wherein the first connection lines each connected between two adjacent row touch control pattern units are formed on the first surface.

A plurality of second connection lines are formed, wherein a first connection segment electrically connected between the first via hole and the column touch control pattern unit adjacent to the first via hole is formed on the first surface, and a second connection segment electrically connected between the second via hole and the column touch control pattern unit adjacent to the second via hole is formed on the first surface, a first conductive line electrically connected to the first via hole and the second via hole is formed on the second surface, the projection of the first conductive line on the first surface and the first connection segment are collinear; the first connection line intersects with the first conductive line on different surfaces between the first via hole and the second via hole.

Furthermore, in the step of forming the second connection line, opposite ends of the first conductive line are electrically connected to the first via hole and the second via hole respectively.

Furthermore, in the step of forming the second connection line, the first conductive line is electrically connected to the first via hole and the second via hole of each column touch control pattern unit in the same column.

Furthermore, in the step of forming the second connection line, the first conductive line is electrically connected to a source of the display driving circuit formed on the second surface, and the display driving circuit is electrically connected to the pixel unit formed on the second surface and configured to light the pixel unit up.

The present invention further provides a method for manufacturing a touch control screen which includes the following steps.

A substrate is provided, wherein the substrate comprises a first surface and a second surface arranged opposite the first surface, the substrate defines via holes penetrating the first surface and the second surface, the via hole comprises a first via hole, a second via hole, a third via hole, and a fourth via hole, and the radial connection line of the first via hole and the second via hole intersects with the radial connection line of the third via hole and the fourth via hole.

A plurality of row touch control pattern units and a plurality of column touch control pattern units are formed, wherein the plurality of row touch control pattern units arranged in rows are formed on the first surface, and the plurality of column touch control pattern units arranged in columns and intersecting with the row touch control pattern units are formed on the first surface.

A plurality of first connection lines are formed, wherein a third connection segment electrically connected between the third via hole and the row touch control pattern unit adjacent to the third via hole is formed on the first surface, and a fourth connection segment electrically connected between the fourth via hole and the row touch control pattern unit adjacent to the fourth via hole is formed on the first surface, and a second conductive line electrically connected to each third via hole and fourth via hole of the same row is formed on the second surface.

A plurality of second connection lines are formed, wherein a first connection segment electrically connected between the first via hole and the column touch control pattern unit adjacent to the first via hole is formed on the first surface, and a second connection segment electrically connected between the second via hole and the column touch control pattern unit adjacent to the second via hole is formed on the first surface, a first conductive line electrically connected to the first via hole and the second via hole is formed on the second surface; the projection of the first conductive line on the first surface and the first connection segment are collinear; the second conductive line intersects with the first conductive line on the second surface.

The present invention further provides a method for manufacturing an OLED touch control display device which includes the following steps.

A substrate is provided, wherein the substrate comprises a first surface and a second surface arranged opposite the first surface.

A touch control screen is manufactured, wherein the method for manufacturing the touch control screen of any of the above is employed to manufacture the touch control screen.

A display area is formed, wherein the display area is formed on the second surface, and the display area comprises a plurality of pixel units arranged in an array and display driving circuits each corresponding to one pixel unit and configured to light the corresponding pixel unit up.

Furthermore, the method for manufacturing the OLED touch control display device further comprises a step of manufacturing interfaces, a touch control interface circuit connected to the touch control screen and an interface binding area connected to the display area are formed on the substrate, the touch control interface circuit and the interface binding area are arranged on the first surface or the second surface of the substrate via the via holes.

In the step of manufacturing the display area, the pixel units comprise a plurality of groups of row pixel units and column pixel units, and the plurality of groups of row pixel units and column pixel units are arranged in an array, the row pixel units comprise a plurality of first pixel units spaced at equal distance, and the column pixel units comprise a plurality of second pixel units spaced at equal distance; each first pixel unit and each second pixel unit are respectively controlled by the corresponding display driving circuits.

In the OLED touch control display device of the present invention, the touch control interface circuit and the interface binding area are arranged on the first surface or second surface of the substrate via the via holes, that is using single-sided IC or FPC coating, process steps can be reduced, which results in reduction of cost. The touch control screen and the display area are respectively arranged on two opposite sides of the same substrate, and the touch control pattern areas are connected together by the via holes, thus the structure is simple, the thickness of the OLED touch control display device can be effectively reduced, and the production cost is reduced.

DETAILED DESCRIPTION OF ILLUSTRATED EMBODIMENTS

To make the purposes, technical solutions, and advantages of the present disclosure be more clearly, the present disclosure will be further described in detail below in combination with the accompanying drawings and embodiments. It should be understood that the detailed embodiments described herein are only used to illustrate the present disclosure, and not used to limit the present disclosure.

Figure 1:
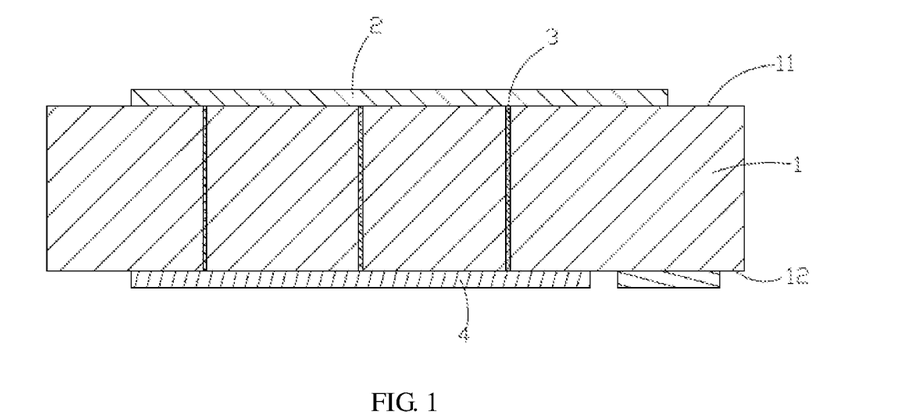
FIG. 1 is a structural schematic view of an OLED touch control display device provided by an exemplary embodiment of the present invention.
Figure 2:
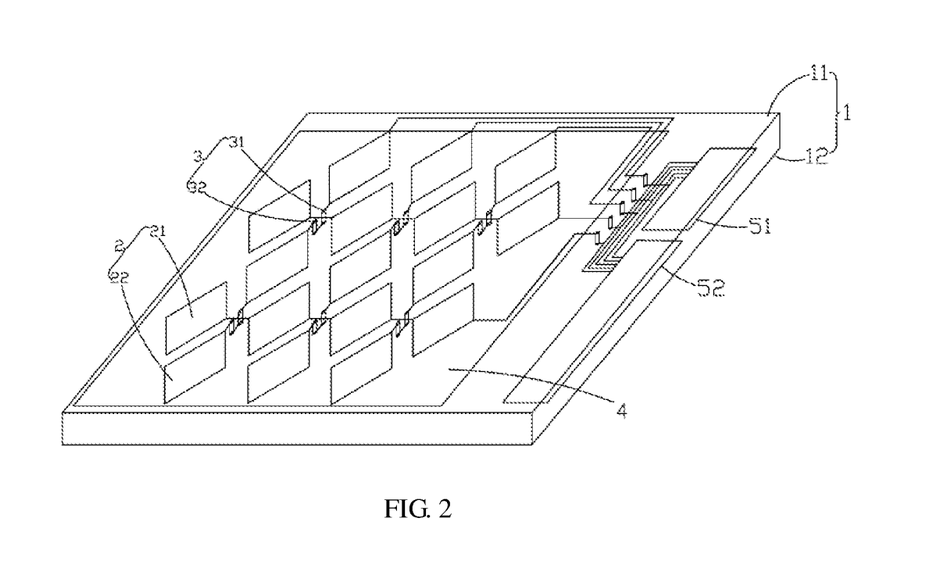
FIG. 2 is a structural schematic view of an OLED touch display device of FIG. 1.

Referring to FIGS. 1 and 2, an OLED touch control display device includes a substrate 1 having a first surface 11 and a second surface 12 arranged opposite the first surface 11, a touch control screen arranged on the first surface 11, a display area 4 arranged on the second surface 12, a touch interface circuit 51 connected to the touch control screen, and an interface binding area 52 connected to the display area 4. The device is provided with a number of via holes 3 penetrating the first surface 11 and the second surface 12, and the via holes 3 are used to arrange the touch interface circuit 51 and the interface binding area 52 on the first surface 11 or the second surface 12 of the substrate 1. The touch control screen includes a number of touch control pattern areas 2 which are arranged in rows and columns and are connected together through the via holes 3. It can be understood that as the touch control interface circuit 51 and the interface binding area 52 are arranged on the first surface 11 or second surface 12 of the substrate 1 through the via holes 3, that is, through single-sided IC or FPC coating, process steps can be reduced, which results in reduction of cost. Preferably, the touch control interface circuit 51 can include a driving interface and a testing interface, and can also include other interfaces. In the OLED touch control display device, by arranging the display area 4 and the touch control pattern areas 2 on the second surface 12 and the first surface 11 of the substrate 1, and connecting the touch control pattern areas 2 together through the via holes 3, the product thickness is reduced, and the flexibility performance and the folding performance of the OLED touch control display device can be effectively enhanced.

Furthermore, the touch control pattern areas 2 include a number of row touch control pattern units 21, a number of column touch control pattern units 22 intersecting with the row touch control pattern units 21, first connection lines 23 each connected between two adjacent row touch control pattern units 21, and second connection lines 24 each connected between two adjacent column touch control pattern units 22. The via hole 3 include a first via hole 31 and a second via hole 32 arranged between two adjacent column touch control pattern units 22. The second connection line 24 includes a first connection segment 241 arranged on the first surface 11 and electrically connected between the first via hole 31 and the column touch control pattern unit 22 adjacent to the first via hole 31, a second connection segment 242 arranged on the first surface 11 and electrically connected between the second via hole 32 and the column touch control pattern unit 22 adjacent to the second via hole 32, and a first conductive line 243 arranged on the second surface 12 and electrically connected to the first via hole 31 and the second via hole 32. The first conductive line 243 intersects with the first connection line 23. It can be understood that the first via hole 31 and the second via hole 32 are filled with conductive medium. By connecting two adjacent column touch control pattern units 22 using the first connection segment 241, the first via hole 31, the first conductive line 243, the second via hole 32, and the second connection segment 242, that is, by disconnecting the column touch control pattern units 22, and by intersecting the first conductive line 243 with the first connection line 23 to form a capacitor, and by connecting the first conductive line 243 and the column touch control pattern units 22 electrically using the first via hole 31 and the second via hole 32, when the screen is touched, the capacity between the row touch control pattern unit 21 and the column touch control pattern unit 22 changes due to coupling between the row touch control pattern unit 21 and the column touch control pattern unit 22 near the touch point, thus positions of all the touch points can be determined by determining the capacity of intersection points of all the row touch control pattern units 21 and all the column touch control pattern units 22 using capacity detection. Optionally, the number of the first via hole 31 and the second via hole 32 can be one, two, or more than two, and can be set according to actual use. The first via hole 31, the second via hole 32, and each column touch control pattern unit 22 are arranged on the same straight line, the projections of the first connection segment 241, the second connection segment 242, and the first conductive line 243 on the first surface 11 are collinear, or the first connection segment 241 and the second connection segment 242 are collinear. Preferably, the first connection line 23 and the second connection line 24 can be made of conductive metal such as molybdenum. In the OLED touch display device provided by embodiments of the present invention, by setting the via hole 3 to cause the first conductive line 243 and the first connection line 23 arranged on the second surface 12 of the substrate 1 to intersect with each other, the row touch control pattern unit 21 and the column touch control pattern unit 22 respectively connected to the first conductive line 243 and the first connection line 23 are mutually coupled on the first surface 11 of the substrate 1, which results in simple structure, thereby the thickness of the OLED touch control display device can be effectively reduced, and the production cost is reduced.

Referring to FIG. 2, furthermore, the first connection line 23 is arranged on the first surface 11 and connected between two adjacent row touch pattern units 21. The first connection segment 241 and the second connection segment 242 are respectively arranged at opposite sides of the first connection line 23, and the projection of the first conductive line 243 on the first surface 11 intersects with the first connection line 23. It can be understood that the first connection line 23 is arranged on the first surface 11, and the first conductive line 243 is arranged on the second surface 12. By causing the first conductive line 243 and the first connection line 23 to intersect with each other, each row touch control pattern unit 21 and the corresponding column touch control pattern unit 22 are mutually coupled, and each row touch control pattern unit 21 and the corresponding column touch control pattern unit 22 are arranged on the first surface 11. Comparing to the present technology of arranging crossover connection lines on the same surface and arranging insulation layers between the connection lines, by arranging the first connection line 23 and the first conductive line 243 on opposite surfaces of the substrate 1 respectively and by connecting the first conductive line 243 to the column touch control pattern unit 22 via the via hole 3, the thickness of the OLED touch control display device can be effectively reduced, which assists the product in meeting the requirement of thinness.

Figure 3:
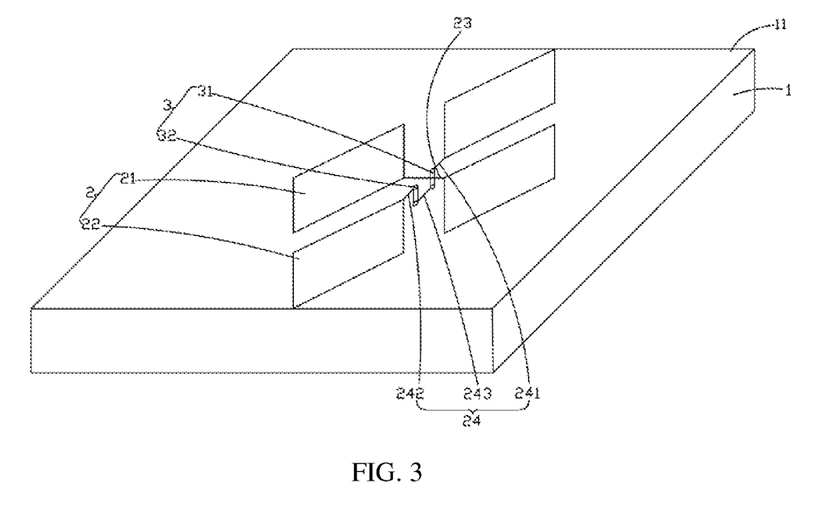
FIG. 3 is a structural schematic view of an OLED touch control display device provided by an exemplary embodiment of the present invention, showing structural features of a first surface.
Figure 4:
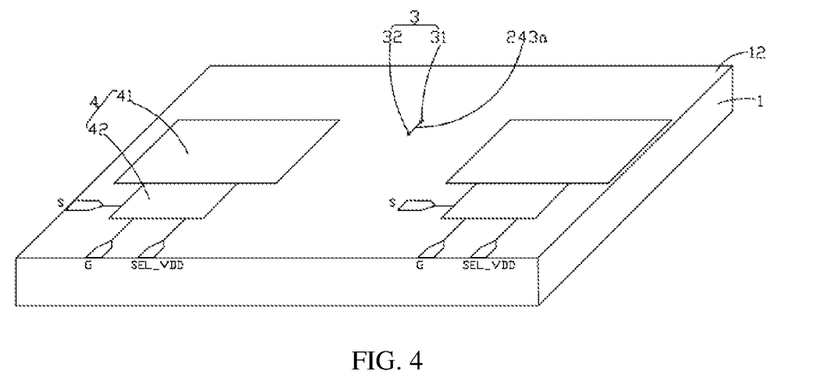
FIG. 4 is a structural schematic view of an OLED touch control display device provided by an exemplary embodiment of the present invention, showing structural features of a second surface.

Referring to FIGS. 2-4, preferably, the first conductive line 243 is a conductive segment 243a, and the opposite sides of the conductive segment 243a are respectively electrically connected to the first via hole 31 and the second via hole 32. The first via hole 31 and the second via hole 32 are connected among the first connection segment 241, the conductive segment 243a, and the second connection segment 242 in serial. It can be understood that adjacent column touch control pattern units 22 are connected together through the first via hole 31, the second via hole 32, and the conductive segment 243a connected between the first via hole 31 and the second via hole 32. In use, by causing the conductive segment 243a and the first connection line 23 connected between the row touch control pattern units 21 to intersect with each other on different surfaces of the substrate 1, the row touch control pattern unit 21 and the column touch control pattern unit 22 are mutually coupled.

Figure 5:
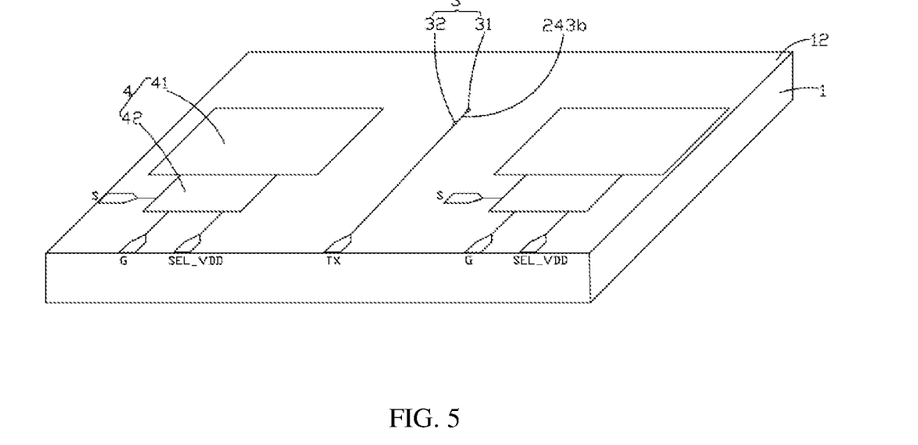
FIG. 5 is a structural schematic view of an OLED touch control display device provided by an exemplary embodiment of the present invention, showing structural features of a second surface.
Figure 6:
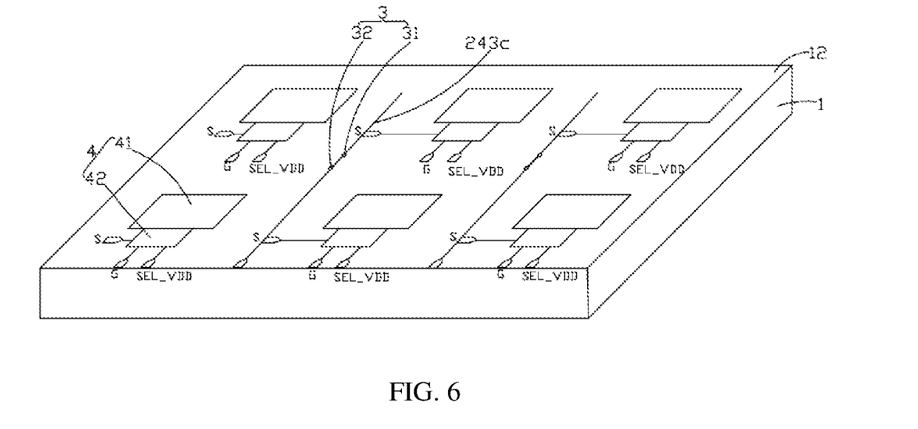
FIG. 6 is a structural schematic view of an OLED touch control display device provided by an exemplary embodiment of the present invention, showing structural features of a second surface.

Referring to FIG. 2, FIG. 5, and FIG. 6, preferably, the first conductive line 243 is a touch control signal line 243b arranged on the second surface 12, and electrically connected to the first via hole 31 and the second via hole 32 of each column touch control pattern unit 22 in the same column. It can be understood that each column touch control pattern unit 22 includes the first via hole 31 and the second via hole 32, and the first via hole 31 and the second via hole 32 penetrates the first surface 11 and the second surface 12, and by arranging the touch control signal line 243b connected between the first via hole 31 and the second via hole 32 of each column touch control unit 22 on the second surface 12, the touch control signal line 243b and the first connection line 23 of the corresponding row touch control pattern unit 21 intersect with each other on different surfaces, that is, each touch control pattern area 2 in the same column shares the same touch control signal line 243b, which results in simple structure and simple process.

Referring to FIG. 2 and FIG. 6, preferably, a number of pixel units 41 are arranged in an array on the second surface 12 and display driving circuits 42 each corresponding to one pixel unit 41 and used to light the corresponding pixel unit 42 up are arranged on the second surface 12. Each display driving circuit 42 includes a source. The first conductive line 243 is a multiplex touch control signal line 243c and electrically connected to the source S of the display driving circuit 42 in the corresponding column. It can be understood that the multiplex touch control signal 243c is arranged on the second surface 12 and connected to the first via hole 31 and the second via hole 32 of each column touch control pattern units 22, and the multiplex touch control signal line 243c is further connected to the source S of each display driving circuit 42. As the pixel units 41 and the display driving circuits 42 are arranged on the second surface 12, the touch control pattern area 2 on the first surface 11 is connected to the pixel unit 41 on the second surface 12 using the multiplex touch control signal line 243c, time-sharing multiplex of touch and display can be realized, the total number of lines can be reduced, and an OLED touch control display device having super narrow sides can be realized.

Figure 7:
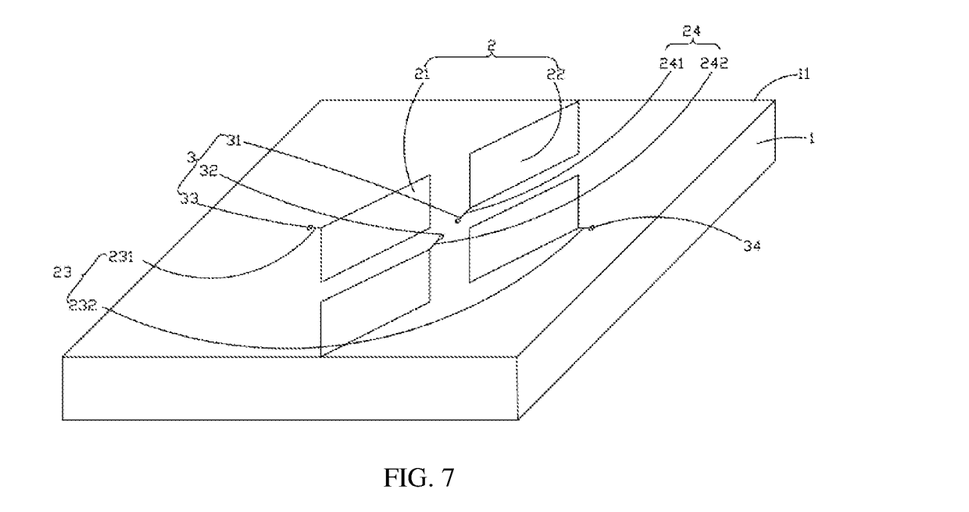
FIG. 7 is a structural schematic view of an OLED touch control display device provided by an exemplary embodiment of the present invention, showing structural features of a first surface.
Figure 8:
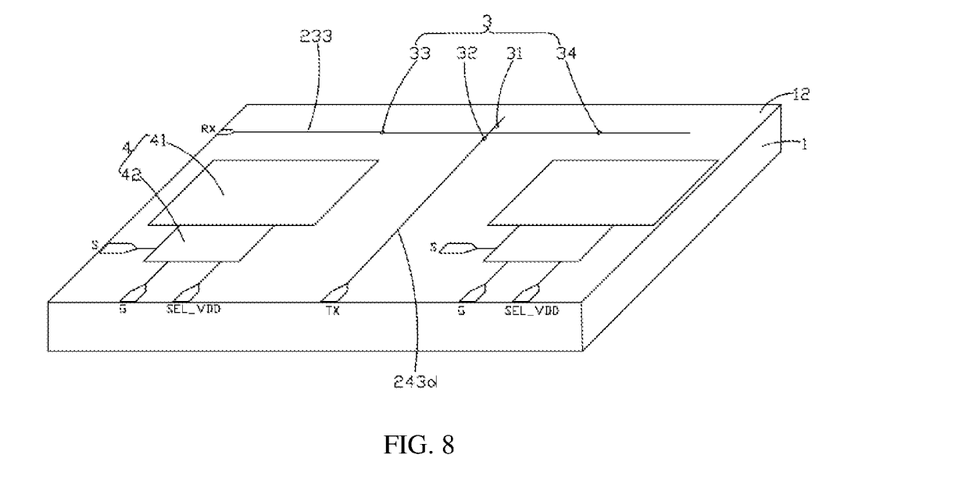
FIG. 8 is a structural schematic view of an OLED touch control display device provided by an exemplary embodiment of the present invention, showing structural features of a second surface.

Referring to FIG. 7 and FIG. 8, furthermore, the via hole 3 further includes a third via hole 33 and a fourth via hole 34 respectively arranged on two sides of two adjacent row touch control pattern units 21. The first connection line 23 includes a third connection segment 231 arranged on the first surface 11 and electrically connected between the third via hole 33 and the row touch control pattern unit 21 adjacent to the third via hole 33, a fourth connection segment 232 arranged on the first surface 11 and electrically connected between the fourth via hole 34 and the row touch control pattern unit 21 adjacent to the fourth via hole 34, and the second conductive line 233 arranged on the second surface 12 and electrically connected to the third via hole 33 and the fourth via hole 34. The second conductive line 233 is electrically connected to the third via hole 33 and the fourth via hole 34 of each row touch control pattern unit 21 in the same row. The first conductive line 243d is electrically connected to the first via hole 31 and the second via hole 32 of each column touch control pattern unit 21 in the same column. On the second surface 12, the first conductive line 243d intersects with the second conductive line 233. It can be understood that two adjacent row touch control pattern units 21 are arranged between the third via hole 33 and the fourth via hole 34, that is, the third via hole 33, two adjacent row touch control pattern units 21, and the fourth via hole 34 are sequentially arranged, and the third via hole 33, two adjacent row touch control pattern units 21, and the fourth via hole 34 are arranged in the same straight line. The row touch control pattern units 21 are disconnected from each other, that is, within the touch control pattern area 2 the row touch control pattern unit 21 and the column touch control pattern unit 22 are independent of each other on the first surface 11. The third via hole 33 and the fourth via hole 34 are filled with conductive medium. The second conductive line 233 is arranged on the second surface 12 and is electrically connected to the third via hole 33 and the fourth via hole 34 of each row touch control pattern unit 21, and the first conductive line 243d is electrically connected to the first via hole 31 and the second via hole 32 of each column touch control pattern unit 22 in the same column, thus, on the second surface 12, the first conductive line 243d and the second conductive line 233 intersect with each other, which causes the row touch control pattern unit 21 and the column touch control pattern unit 22 to be mutually coupled, and the row touch control pattern unit 21 and the column touch control pattern unit 22 are on the first surface 11.

Referring to FIG. 2, furthermore, the touch control screen further includes a touch control interface circuit 51 arranged on the first surface 11 or the second surface 12. The touch control interface circuit 51 includes a driving interface and a test interface (not shown). The third via hole 3 is electrically connected to the driving interface and the test interface through the second connection line 24, or the via hole 3 is electrically connected to the driving interface and the test interface via the first connection line 23 and the second connection line 24. It can be understood that the touch control interface circuit 51 can be arranged on the first surface 11 or the second surface 12 according to actual use. For the condition of that the first connection line 23 intersects with the second connection line 24 on different surfaces, the first via hole 31 and the second via hole 32 are electrically connected to the driving interface and the test interface through the first connection line 23. For the condition of that the first connection line 23 intersects with the second connection line 24 on the second surface 12, the third via hole 33 and the fourth via hole 34 are electrically connected to the driving interface and the test interface through the first connection line 23, and the first via hole 31 and the second via hole 32 are electrically connected to the driving circuit and the test circuit through the second connection line 24, and such a method of setting the driving circuit and the test interface assists in reducing process steps, which results in reduction of cost.

Referring to FIG. 2 and FIG. 3, furthermore, the column touch control pattern unit 22 and the row touch control pattern unit 21 can be quadrilateral shaped, pentagon shaped, hexagon shaped, circle shaped, or any other shape. Preferably, the column touch control pattern unit 22 and the row touch control pattern unit 21 are rhombus shaped. In other embodiments, the column touch control pattern unit 22 and the row touch control pattern unit 21 can be other pattern, e.g., triangle shaped, oval shaped, or other shape.

Referring to FIG. 1, furthermore, the substrate 1 is a glass substrate or flexible substrate. Preferably, the flexible substrate is made from polyethylene (PE), polypropylene (PP), polystyrene (PS), Polyethylene terephthalate (PET), polyethylene naphthalate (PEN), polyimide (PT).

Referring to FIGS. 1-8, furthermore, the display area 4 includes a number of pixel units 41 arranged in an array and a number of display driving circuits 42 each corresponding to one pixel unit 41 and configured for lighting the corresponding pixel unit 41 up. It can be understood that the touch control screen can the touch control screen structure described in any of the above embodiments, and the description of each above embodiment can be referred, which will not be repeated herein. Each display driving circuit 42 is electrically connected to a gate driving circuit, a source driving circuit, and a common voltage (SEL-VDD), and receives gate driving signals from the gate driving circuit, source driving signals from the source driving circuit, and SEL-VDD, and drives the corresponding pixel unit 41 to display image. Preferably, the display driving circuit 42 is an TFT-OLED source driving circuit. Optionally, the OLED touch control display device can further include an interface binding area 52 arranged on the second surface 12 and further arranged on a side of the display area 4. The interface binding area 52 includes a driving IC and a FPC (not shown), and the driving IC and the FPC are electrically connected to output terminals of the display driving circuit 42. The row touch control pattern units 21 and the column touch control pattern units 22 are connected together through the via holes 3 to form a touch control circuit. In the OLED touch control display device provided by the embodiments of the present invention, the display driving circuits 42 and the touch control interface circuit 51 are arranged on the first surface 11 or the second surface 12 of the substrate 1 through the via holes 3, and are attached to the driving IC and the FPC by the single side attachment method, which reduces process steps and effectively reduce production cost. Preferably, the touch control interface circuit 51 can include the driving interface and the test interface, and can also include other interfaces. The OLED light-emission process is used, that is, the display layer formed by the pixel units 41 are arranged on the second surface 12 of the substrate 1, and the touch player formed by the row touch control pattern units 21 and the column touch control pattern units 22 is arranged on the first surface 11 of the substrate 1, that is, the touch player is arranged above the display layer, thus the best touch performance is provided.

Due to difference of setting manners of the first conductive line 243 and the first connection line 23, the touch and display modes of the OLED touch control display device are different, and there are several manners described below.

Referring to FIG. 2 and FIG. 3, manner 1: the first connection line 23 is arranged on the first surface 11 and connected between two adjacent row touch control pattern units 21, and two ends of the conductive line segment 243a are respectively electrically connected to the first via hole 31 and the second via hole 32, that is, the conductive line segment 243a is connected to the row touch control pattern unit 21 and the column touch control pattern unit 22 arranged on the first surface 11 through the first via hole 31, the second via hole 32, and the conductive line segment 243a arranged on the second surface 12, so as to realize touch function. The conductive line segment 243 is arranged between two adjacent columns of the pixel units 41, and spaced from the pixel units 41, that is, the conductive line segment 243a is separated from the pixel units 41 arranged on the second surface 12 in an array, thereby touch function and display function are separated and independent of each other.

Referring to FIG. 2 and FIG. 4, manner 2: the first connection line 23 is arranged on the first surface 11 and connected between two adjacent row touch control pattern units 21, the first conductive line 243 is a touch control signal line 243b arranged on the second surface 12, and electrically connected to the first via hole 31 and the second via hole 32 of each column touch control pattern unit 22 in the same column, that is, the first conductive line 243 is connected to the row touch control pattern units 21 and the column touch control pattern units 22 arranged on the first surface 11 through the first via hole 31, the second via hole 32, and the touch control signal line 243*b* arranged on the second surface 12, that is, the column touch control pattern units 22 in the same column share the same touch control signal line 243*b* to realize touch function. The touch control signal line 243*b* is arranged between two adjacent columns of the pixel units 41, and spaced from the pixel units 41 arranged on the second surface 12 in an array, thereby touch function and display function are separated and independent of each other.

Referring to FIG. 2 and FIG. 5, manner 3: the first connection line 23 is arranged on the first surface 11 and connected between two adjacent row touch control pattern units 21, and the first conductive line 243 is a multiplex touch control signal line 243*c* arranged on the second surface 12, and electrically connected to the first via hole 31 and the second via hole 32 of each column touch control pattern unit 22 in the same column, and electrically connected to the source S of the display driving circuit 42, that is, the first conductive line 243 is connected to the first and second row touch control pattern units 211, 212 and the first and second column touch control pattern units 221, 222 through the first via hole 31 and the second via hole of the same column and the multiplex touch control signal line 243*c* arranged on the second surface 12, that is, the column touch control pattern units 22 in the same column share the same multiplex touch control signal line 243 to realize touch control function. Furthermore, the multiplex touch control signal line 243 is arranged between two adjacent columns of the pixel units 41 and connected to the source S of each display driving circuit 42, that is, the display driving circuit 42 is connected to the touch control interface circuit 51 through the first via hole 31 and the second via hole 32 to realize time division multiplex access (TDMA) of touch control and display.

Referring to FIG. 6 and FIG. 7, manner 4: different from manner 2, the third via hole 33 and the fourth via hole 34 are further arranged on the substrate 1, the third via hole 33 and the fourth via hole 34 are connected to the first connection line 23', and the connection manner of connecting the first connection line 23' is improved, that is, the first connection line 23' includes a third connection line 231 arranged on the first surface 11 and electrically connected between the first row touch control pattern unit 211 and the third via hole 33, a fourth connection line 232 arranged on the first surface 11 and electrically connected between the second row touch control pattern unit 212 and the fourth via hole 34, and a second conductive line 233 arranged on the second surface 12 and electrically connected to the third via hole 33 and the fourth via hole 34. The row touch control pattern unit 21 and the column touch control pattern unit 22 are connected to the intersection point of the first conductive line 243*d* and the second conductive line 233 through each via hole 3 to realize touch control function. The first conductive line 243*d* is arranged between two adjacent rows of the pixel units 41, and the first conductive line 243*d* and the second conductive line 233 are separated from the pixel units 41 which are arranged in an array on the second surface 12, thus touch function and display function are separated and independent of each other.

In the above four manners, the first conductive line 243 can be arranged among several columns of the pixel units 41, for example, four columns, six columns, or other. Similarly, the second conductive line 233 can be arranged among several rows of the pixel units 41, for example, four rows, six rows, or other. The positions of the first conductive line 243 and the second conductive line 233 are related to corresponding relationship between the touch control pattern area 2 and the pixel unit 41.

Referring to FIGS. 2-6, furthermore, the pixel units 41 include a number of groups of row pixel units 41 and column pixel units 41, and the row pixel units 41 and the column pixel units 41 are arranged in an array. The row pixel units 41 include a number of first pixel units 41 spaced at equal distance, and the column pixel units 41 include a number of second pixel units 41 spaced at equal distance. Each first pixel unit 41 and each second pixel unit 41 are respectively controlled by the corresponding display driving circuits 42. It can be understood that each pixel unit 41 is lit up by the corresponding display driving circuit 42. In the above manners, the same touch control pattern area 2 corresponds to at least one array of the pixel units 41. The first conductive line 243 of the touch control pattern area 2 is arranged on the symmetric line of the array of the pixel units 41. The direction of the symmetric line is the same as that of the column touch control pattern unit 22.

Referring to FIGS. 1-5, the method for manufacturing the touch control screen includes the following steps.

A substrate 1 is provided. The substrate 1 includes a first surface 11 and a second surface 12 arranged opposite the first surface 11. The substrate 1 defines a number of via holes 3 extending through the first surface 11 and the second surface 12. The via hole 3 includes a first via hole 31 and a second via hole 32. It can be understood that the number and positions of the first via holes 31 and the second via holes 32 can be set according to the number and positions of touch control pattern areas 2. The first via hole 31 and the second via hole 32 are filled with conductive medium.

A number of row touch control pattern units 21 and column touch control pattern units 22 are formed. A number of row touch control pattern units 21 arranged in rows are formed on the first surface 11, and a number of column touch control pattern units 22 arranged in columns and intersecting with the row touch control pattern units 21 are formed on the first surface 11. It can be understood that the row touch control pattern unit 21 and the column touch control pattern unit 22 can be quadrangle shaped, pentagon shaped, hexagon shaped, or circle shaped. Preferably, the row touch control pattern unit 21 and the column touch control pattern unit 22 are rhombus shaped. In other embodiments, the row touch control pattern unit 21 and the column touch control pattern unit 22 can be other shapes, for example, triangle shaped, ellipse shaped, or other shapes.

A number of first connection lines 23 are formed. The first connection line 23 connected between two adjacent row touch control pattern units 21 is formed on the first surface 11. It can be understood that the first connection line 23 is a metal conductive line, and is formed on the substrate 1 via the depositing, coating, or sputtering manner.

A number of second connection lines 24 are formed. A first connection segment 241 electrically connected between the first via hole 31 and the column touch control pattern unit 22 adjacent to the first via hole 31 is formed on the first surface 11, and a second connection segment 242 electrically connected between the second via hole 32 and the column touch control pattern unit 22 adjacent to the second via hole 32 is formed on the first surface 11. A first conductive line 243 electrically connected to the first via hole 31 and the second via hole 32 is formed on the second surface 12. The projection of the first conductive line 243 on the first surface 11 and the first connection segment 241 are collinear. The first connection line 23 intersects with the first conductive line 243 on different surfaces between the first via hole 31 and the second via hole 32. In can be understood that the first connection segment 241 and the second connection segment 242 are collinear and disconnected from each other. The central connection line of the column touch control pattern units 22, the first connection segment 241, and the second connection segment 242 are collinear. The first connection segment 241 and the second connection segment 242 are arranged between two adjacent column touch control pattern units 222. The second connection line 24 is a metal conductive line, and is formed on the substrate 1 via the depositing, coating, or sputtering manner.

In the method of manufacturing the touch control screen provided by the embodiment of the present invention, the via hole 3 is defined on the substrate 1, and the first conductive line 243 is formed on the second surface 12 to connect the first and second row touch control pattern unit 212 and the first and second column touch control pattern unit 222, and the first and second row touch control pattern unit 212 and the first and second column touch control pattern unit 222 are arranged on the first surface 11, thus the first conductive line 243 intersects with the first connection line 23 on the second surface 12 and the first surface 11 to realize touch control function.

Referring to FIG. 2 and FIG. 3, furthermore, in the step of forming the second connection line 24, the first conductive line 243 is a conductive line segment 243a and its opposite ends are electrically connected between the first via hole 31 and the second via hole 32 respectively. It can be understood that the conductive line segment 243a is arranged between the first via hole 31 and the second via hole, so as to be connected to the column touch control pattern unit 22 via the first via hole 31 and the second via hole 32. The conductive line segment 243a intersects with the first connection line 23 on the second surface 12 and the first surface 11 of the substrate 1, so as to realize mutual coupling between the row touch control pattern unit 21 and the column touch control pattern unit 22, and the row touch control pattern unit 21 and the column touch control pattern unit 22 are arranged on the first surface 11, thus touch control function is realized.

Referring to FIG. 2 and FIG. 4, furthermore, in the step of forming the second connection line 24, the first conductive line 243 is a touch control signal line 243b, and electrically connected to the first via hole 31 and the second via hole 32 of each column touch control pattern unit 22 in the same column. It can be understood that the first via hole 31 and the second via hole 32 of each column touch control pattern unit 22 in the same column share the same touch control signal line 243b, and the process is simple. The touch control signal line 243b intersects with the first connection line 23 of the corresponding row touch control pattern unit 21, so as to realize mutual coupling between the row touch control pattern unit 21 and the column touch control pattern unit 22, and the row touch control pattern unit 21 and the column touch control pattern unit 22 are arranged on the first surface 11, thus touch control function is realized.

Referring to FIG. 2 and FIG. 5, furthermore, in the step of forming the second connection line 24, the first conductive line 243 is a multiplex touch control signal line 243c and electrically connected to the source S of the display driving circuit 42 which is formed on the second surface 12. The display driving circuit 42 is electrically connected to the pixel unit 41 formed on the second surface 12 and lights the pixel unit 41 up. It can be understood that the first via hole 31 and the second via hole 32 of each column touch control pattern unit 22 in the same column share the same multiplex touch control signal line 243c, and the process is simple. The multiplex touch control signal line 243c intersects with the first connection line 23 of the corresponding touch control pattern unit 21, so as to realize mutual coupling between the row touch control pattern unit 21 and the column touch control pattern unit 22, and the row touch control pattern unit 21 and the column touch control pattern unit 22 are arranged on the first surface 11, thus touch control function is realized. Furthermore, the multiplex touch control signal line 243c is further electrically connected to the source S of the display driving circuit 42 which is arranged on the second surface 12, thus time division multiplex access (TDMA) of touch control and display is realized, and the total number of lines is reduced, which assists in designing an OLED touch control display device having super narrow sides.

Referring to FIG. 1, FIG. 6, and FIG. 7, the method for manufacturing the touch control screen provided by the embodiments of the present invention includes the following steps.

A substrate 1 is provided. The substrate 1 includes a first surface 11 and a second surface 12 arranged opposite the first surface 11. The substrate 1 defines a number of via holes 3 extending through the first surface 11 and the second surface 12. The via hole 3 includes a first via hole 31, a second via hole 32, a third via hole 33, and a fourth via hole 34. The radial connection line of the first via hole 31 and the second via hole 32 intersects with the radial connection line of the third via hole 33 and the fourth via hole 34. It can be understood that the number and positions of the first via holes 31, the second via holes 32, the third via hole 33, and the fourth via hole 34 can be set according to the number and positions of touch control pattern areas 2. The first via hole 31, the second via hole 32, the third via hole 33, and the fourth via hole 34 are filled with conductive medium.

A number of row touch control pattern units 21 and column touch control pattern units 22 are formed. A number of row touch control pattern units 21 arranged in rows are formed on the first surface 11, and a number of column touch control pattern units 22 arranged in columns and intersecting with the row touch control pattern units 21 are formed on the first surface 11. It can be understood that the row touch control pattern unit 21 and the column touch control pattern unit 22 can be quadrangle shaped, pentagon shaped, hexagon shaped, or circle shaped. Preferably, the row touch control pattern unit 21 and the column touch control pattern unit 22 are rhombus shaped. In other embodiments, the row touch control pattern unit 21 and the column touch control pattern unit 22 can be other shapes, for example, triangle shaped, ellipse shaped, or other shapes.

A number of first connection lines 23 are formed. A third connection segment 231 electrically connected between the third via hole 33 and the row touch control pattern unit 21 adjacent to the third via hole 33 is formed on the first surface 11, and a fourth connection segment 232 electrically connected between the fourth via hole 34 and the row touch control pattern unit 21 adjacent to the fourth via hole 34 is formed on the first surface 11. A second conductive line 233 electrically connected to each third via hole 33 and fourth via hole 34 of the same row is formed on the second surface 12. It can be understood that the third connection segment 231 and the fourth connection segment 232 are collinear and disconnected from each other. The central connection line of the row touch control pattern units 21, the third connection segment 231, and the fourth connection segment 232 are collinear. The third connection segment 231 and the fourth connection segment 232 are arranged between two adjacent row touch control pattern units 21. The projection of the second conductive line 233 on the first surface 11, the third connection segment 231, and the fourth segment 232 are collinear. The first connection line 23 is a metal conductive line, and is formed on the substrate 1 via the depositing, coating, or sputtering manner.

A number of second connection lines 24 are formed. A first connection segment 241 electrically connected between the first via hole 31 and the column touch control pattern unit 22 adjacent to the first via hole 31 is formed on the first surface 11, and a second connection segment 242 electrically connected between the second via hole 32 and the column touch control pattern unit 22 adjacent to the second via hole 32 is formed on the first surface 11. A first conductive line 243 electrically connected to the first via hole 31 and the second via hole 32 is formed on the second surface 12. On the second surface 12, the second conductive line 233 intersects with the first conductive line 243. In can be understood that the first connection segment 241 and the second connection segment 242 are collinear and disconnected from each other. The central connection line of the column touch control pattern units 22, the first connection segment 241, and the second connection segment 242 are collinear. The first connection segment 241 and the second connection segment 242 are arranged between two adjacent column touch control pattern units 222. The projection of the first conductive line 243 on the first surface 11, the first connection segment 241, and the second connection segment 242 are collinear. The second connection line 24 is a metal conductive line, and is formed on the substrate 1 via the depositing, coating, or sputtering manner.

In the method of manufacturing the touch control screen provided by the embodiment of the present invention, the via hole 3 is defined on the substrate 1, and the first conductive line 243 and the second conductive line 233 are formed on the second surface 12 to be connected to the first and second row touch control pattern units 212 and the first and second column touch control pattern units 222, and the first and second row touch control pattern units 212 and the first and second column touch control pattern units 222 are arranged on the first surface 11, thus the first conductive line 243 intersects with the first connection line 23 on the second surface 12 and the first surface 11 to realize touch control function.

Referring to FIGS. 1-8, the method for manufacturing an OLED touch control display device provided by an embodiment of the present invention includes the following steps.

A substrate 1 is provided. The substrate 1 includes a first surface 11 and a second surface 11 arranged opposite the first surface 11.

A touch control screen is manufactured. The above method for manufacturing the touch control screen is employed to manufacture the touch control screen. It can be understood that the detailed method is the method for manufacturing the touch control screen in each of the above embodiments, which will not be repeated herein.

A display area 4 is manufactured. The display area 4 is formed on the second surface 12. The display area 4 includes a number of pixel units 41 arranged in an array and display driving circuits 42 each corresponding to one pixel unit 41 and configured to light the corresponding pixel unit 41 up. It can be understood that by arranging the display area 4 on the second surface 12, that is, arranging the display area 4 and the touch control pattern area 2 on opposite surfaces of the substrate 1, the thickness of the OLED touch control device can be effectively reduced. Furthermore, by arranging the display area 4 and the touch control pattern area 2 formed in the above steps on the same substrate 1, the touch function is independent of the display function or the function of TDMA of touch and display can be realized, which can effectively reduce the total number of lines, and thus assist in realizing supper narrow side design.

Furthermore, the method for manufacturing the OLED touch control display device can further include a step of manufacturing interfaces. On the substrate 1, a touch control interface circuit 51 connected to the touch control screen and an interface binding area 52 connected to the display area 4 are manufactured. The touch control interface circuit 51 and the interface binding area 52 are arranged on the first surface 11 or the second surface 12 of the substrate 1 via the via hole 3. It can be understood that the touch control interface circuit 51 and the interface binding area 52 are arranged on the first surface 11 or second surface 12 of the substrate 1 via the via holes 3, that is using single-sided IC or FPC coating, process steps can be reduced, which results in reduction of cost. Preferably, the touch control interface circuit 51 can include a driving interface and a testing interface, and can also include other interfaces.

Furthermore, in the step of manufacturing the display area 4, the pixel units 41 include a number of groups of row pixel units 41 and column pixel units 41, and the row pixel units 41 and the column pixel units 41 are arranged in an array. The row pixel units 41 include a number of first pixel units 41 spaced at equal distance, and the column pixel units 41 include a number of second pixel units 41 spaced at equal distance. Each first pixel unit 41 and each second pixel unit 41 are respectively controlled by the corresponding display driving circuits 42. It can be understood that each pixel unit 41 is lit up by the corresponding display driving circuit 42. In the above manners, the same touch control pattern area 2 corresponds to at least one array of the pixel units 41. The first conductive line 243 of the touch control pattern area 2 is arranged on the symmetric line of the array of the pixel units 41. The direction of the symmetric line is the same as that of the column touch control pattern unit 22.

The foregoing descriptions are merely preferred embodiments of the present disclosure, rather than limiting the present disclosure. Any modification, equivalent substitution, improvement or the like made within the spirit and principle of the present disclosure shall fall into the protection scope of the present disclosure.

What is claimed is:
1. An OLED touch control display device, comprising:
   a substrate comprising a first surface and a second surface arranged opposite the first surface;
   a touch control screen arranged on the first surface;
   a display area arranged on the second surface;
   a touch control interface circuit connected to the touch control screen;
   an interface binding area connected to the display area; and
   a plurality of via holes penetrating the first surface and the second surface, wherein the touch control interface circuit and the interface binding area are arranged on the first surface or the second surface of the substrate, and the touch control screen comprises a plurality of touch control pattern areas arranged in a matrix and connected together through the via holes;
   wherein, the touch control pattern areas comprise:
      a plurality of row touch control pattern units;
      a plurality of column touch control pattern units intersecting with the row touch control pattern units;
      first connection lines each connected between two adjacent row touch control pattern units; and second connection lines each connected between two adjacent column touch control pattern units;
wherein, the plurality of via holes comprises:
a first via hole and a second via hole, the first via hole and the second via hole are arranged between two adjacent column touch control pattern units;
the second connection line comprises:
a first connection segment arranged on the first surface and electrically connected between the first via hole and the column touch control pattern unit adjacent to the first via hole;
a second connection segment arranged on the first surface and electrically connected between the second via hole and the column touch control pattern unit adjacent to the second via hole; and
a first conductive line arranged on the second surface and electrically connected to the first via hole and the second via hole;
the first conductive line intersects with the first connection line;
wherein, the plurality of via holes further comprises:
a third via hole and a fourth via hole; the third via hole and the fourth via hole are arranged at two sides of two adjacent row touch control pattern units;
the first connection line further comprises:
a third connection segment arranged on the first surface and electrically connected between the third via hole and the row touch control pattern unit adjacent to the third via hole;
a fourth connection segment arranged on the first surface and electrically connected between the fourth via hole and the row touch control pattern unit adjacent to the fourth via hole; and
a second conductive line arranged on the second surface and electrically connected to the third via hole and the fourth via hole; the second conductive line is electrically connected to the third via hole and the fourth via hole of each row touch control pattern unit in a same row;
the first conductive line is electrically connected to the first via hole and the second via hole of each column touch control pattern unit in a same column, and the first conductive line intersects with the second conductive line on the second surface.

2. The OLED touch control display device of claim 1, wherein the first connection line is arranged on the first surface and connected between two adjacent row touch control pattern units, the first connection segment and the second connection segment are arranged at opposite sides of the first connection line, and a projection of the first conductive line on the first surface intersects with the first connection line.

3. The OLED touch control display device of claim 2, wherein opposite ends of the first conductive line are electrically connected to the first via hole and the second via hole respectively, the first via hole and the second via hole are connected in serial among the first connection segment, the first conductive line, and the second connection segment.

4. The OLED touch control display device of claim 2, wherein the first conductive line is a touch control signal line arranged on the second surface, and electrically connected to the first via hole and the second via hole of each column touch control pattern unit in a same column.

5. The OLED touch control display device of claim 4, wherein a plurality of pixel units arranged in an array and display driving circuits each corresponding to one pixel unit and configured to light up the corresponding pixel unit are arranged on the second surface, each display driving circuit comprises a source, the first conductive line is a multiplex touch control signal line and electrically connected to the source of the display driving circuit of a corresponding column.

6. The OLED touch control display device of claim 1, wherein the touch control screen further comprises a touch control interface circuit arranged on the first surface or the second surface, the touch control interface circuit comprises a driving interface and a test interface, the plurality of via holes are electrically connected to the driving interface and the test interface through the second connection line, or the plurality of via holes are electrically connected to the driving interface and the test interface through the first connection line and the second connection line.

7. The OLED touch control display device of claim 1, wherein the column touch control pattern units and the row touch control pattern units are quadrilateral shaped, pentagon shaped, hexagon shaped, or circle shaped.

8. The OLED touch control display device of claim 1, wherein the substrate is a glass substrate or flexible substrate.

9. The OLED touch control display device of claim 1, wherein the display area comprises a plurality of pixel units arranged in an array and display driving circuits each corresponding to one pixel unit and configured to light up the corresponding pixel unit.

10. The OLED touch control display device of claims 9, wherein the pixel units comprise a plurality of groups of row pixel units and column pixel units, and the plurality of groups of row pixel units and column pixel units are arranged in an array, the row pixel units comprise a plurality of first pixel units spaced at an equal distance, the column pixel units comprise a plurality of second pixel units spaced at an equal distance; each first pixel unit and each second pixel unit are respectively controlled by corresponding display driving circuits.

11. The OLED touch control display device of claim 1, wherein the touch control screen further comprises a touch control interface circuit arranged on the first surface or the second surface, the touch control interface circuit comprises a driving interface and a test interface, the plurality of via holes are electrically connected to the driving interface and the test interface through the second connection line, or the plurality of via holes are electrically connected to the driving interface and the test interface through the first connection line and the second connection line.

12. A method for manufacturing a touch control screen, comprising:
providing a substrate, wherein the substrate comprises a first surface and a second surface arranged opposite the first surface, the substrate defines a plurality of via holes penetrating the first surface and the second surface, the plurality of via holes comprise a first via hole, a second via hole, a third via hole and a fourth via hole;
forming a plurality of row touch control pattern units and a plurality of column touch control pattern units, wherein the plurality of row touch control pattern units arranged in rows are formed on the first surface, and the plurality of column touch control pattern units arranged in columns and intersecting with the row touch control pattern units are formed on the first surface, wherein, the first via hole and the second via hole are formed between two adjacent column touch control pattern units, and the third via hole and the fourth via hole are formed at two sides of two adjacent row touch control pattern units;

forming a plurality of first connection lines, wherein the first connection lines each connected between two adjacent row touch control pattern units are formed on the first surface, a third connection segment electrically connected between the third via hole and the row touch control pattern unit adjacent to the third via hole is formed on the first surface; a fourth connection segment electrically connected between the fourth via hole and the row touch control pattern unit adjacent to the fourth via hole is formed on the first surface; a second conductive line electrically connected to the third via hole and the fourth via hole is formed on the second surface; the second conductive line is electrically connected to the third via hole and the fourth via hole of each row touch control pattern unit in a same row; and forming a plurality of second connection lines, wherein a first connection segment electrically connected between the first via hole and the column touch control pattern unit adjacent to the first via hole is formed on the first surface, and a second connection segment electrically connected between the second via hole and the column touch control pattern unit adjacent to the second via hole is formed on the first surface, a first conductive line electrically connected to the first via hole and the second via hole is formed on the second surface, a projection of the first conductive line on the first surface and the first connection segment are collinear; the first connection line intersects with the first conductive line on different surfaces between the first via hole and the second via hole; wherein the first conductive line is electrically connected to the first via hole and the second via hole of each column touch control pattern unit in a same column, and the first conductive line intersects with the second conductive line on the second surface.

13. The method for manufacturing the touch control screen of claim 12, wherein in forming the second connection line, opposite ends of the first conductive line are electrically connected to the first via hole and the second via hole respectively.

14. The method for manufacturing the touch control screen of claim 12, wherein forming the second connection line, the first conductive line is electrically connected to a source of a display driving circuit formed on the second surface, the display driving circuit is electrically connected to the pixel unit formed on the second surface and configured to light up the pixel unit.

15. A method for manufacturing an OLED touch control display device, comprising:
providing a substrate, wherein the substrate comprises a first surface and a second surface arranged opposite the first surface;
manufacturing a touch control screen, wherein the method for manufacturing the touch control screen of claim 12 is employed to manufacture the touch control screen; and
manufacturing a display area, wherein the display area is formed on the second surface, the display area comprises a plurality of pixel units arranged in an array and display driving circuits each corresponding to one pixel unit and configured to light up the corresponding pixel unit.

16. The method for manufacturing an OLED touch control display device of claim 15, wherein the method further comprises a step of manufacturing interfaces, a touch control interface circuit connected to the touch control screen and an interface binding area connected to the display area are formed on the substrate, the touch control interface circuit and the interface binding area are arranged on the first surface or the second surface of the substrate.

17. The method for manufacturing an OLED touch control display device of claim 15, wherein in manufacturing the display area, the pixel units comprise a plurality of groups of row pixel units and column pixel units, and the plurality of groups of row pixel units and column pixel units are arranged in an array, the row pixel units comprise a plurality of first pixel units spaced at an equal distance, and the column pixel units comprise a plurality of second pixel units spaced at an equal distance; each first pixel unit and each second pixel unit are respectively controlled by corresponding display driving circuits.

* * * * *